(12) United States Patent
Kim et al.

(10) Patent No.: US 9,458,365 B2
(45) Date of Patent: Oct. 4, 2016

(54) TEMPORARY BONDING ADHESIVE COMPOSITIONS AND METHODS OF MANUFACTURING A SEMICONDUCTOR DEVICE USING THE SAME

(71) Applicant: Shin-Etsu Chemical Co., Ltd., Tokyo (JP)

(72) Inventors: Tae-Hoon Kim, Anyang-si (KR); Hideto Kato, Annaka (JP); Jae-Hyun Kim, Yongin-si (KR); Jun-Won Han, Seoul (KR); Hiroyuki Yasuda, Annaka (JP); Shohei Tagami, Annaka (JP); Michihiro Sugo, Annaka (JP); Jung-Sik Choi, Seongnam-si (KR)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/334,265

(22) Filed: Jul. 17, 2014

(65) Prior Publication Data
US 2015/0024574 A1 Jan. 22, 2015

(30) Foreign Application Priority Data
Jul. 22, 2013 (KR) .................. 10-2013-0085832

(51) Int. Cl.
| | | |
|---|---|---|
| *C09J 183/04* | (2006.01) | |
| *C09J 183/06* | (2006.01) | |
| *C08G 77/00* | (2006.01) | |
| *C08G 77/52* | (2006.01) | |
| *B32B 27/28* | (2006.01) | |
| *H01L 21/683* | (2006.01) | |
| *H01L 25/065* | (2006.01) | |
| *H01L 25/00* | (2006.01) | |
| *B05D 3/02* | (2006.01) | |

(52) U.S. Cl.
CPC ............ *C09J 183/06* (2013.01); *B32B 27/283* (2013.01); *C08G 77/52* (2013.01); *C08G 77/70* (2013.01); *C09J 183/04* (2013.01); *H01L 21/6835* (2013.01); *H01L 25/0652* (2013.01); *H01L 25/50* (2013.01); *B05D 3/02* (2013.01); *H01L 2221/6834* (2013.01); *H01L 2221/68327* (2013.01); *H01L 2221/68381* (2013.01); *H01L 2224/16225* (2013.01); *H01L 2225/06513* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 6,171,385 B1 | 1/2001 | Rurlaender et al. | |
| 6,930,023 B2 | 8/2005 | Okada et al. | |
| 7,541,264 B2 | 6/2009 | Gardner et al. | |
| 9,096,032 B2 * | 8/2015 | Kato | B32B 7/06 |
| 2009/0218560 A1 | 9/2009 | Flaim et al. | |
| 2009/0294023 A1 * | 12/2009 | Beger et al. | 156/106 |
| 2011/0151176 A1 | 6/2011 | Akiyama et al. | |
| 2012/0028438 A1 | 2/2012 | Richter | |
| 2012/0073741 A1 | 3/2012 | Asai et al. | |
| 2013/0029145 A1 * | 1/2013 | Kato et al. | 428/354 |
| 2013/0280886 A1 * | 10/2013 | Kato | B32B 7/06 438/459 |
| 2014/0106137 A1 * | 4/2014 | Kondo | H01L 21/6835 428/195.1 |

FOREIGN PATENT DOCUMENTS

| | | |
|---|---|---|
| JP | 1994-053194 | 2/1994 |
| JP | 2002-309187 | 10/2002 |
| JP | 2011-146731 | 7/2011 |
| KR | 20090095242 A | 9/2009 |

* cited by examiner

*Primary Examiner* — Marc Zimmer
(74) *Attorney, Agent, or Firm* — Myers Bigel & Sibley, P.A.

(57) ABSTRACT

A temporary bonding adhesive composition includes a first compound including a thermosetting polyorganosiloxane and a second compound including a thermoplastic polyorganosiloxane.

18 Claims, 4 Drawing Sheets

TEMPORARY BONDING ADHESIVE COMPOSITIONS AND METHODS OF MANUFACTURING A SEMICONDUCTOR DEVICE USING THE SAME

CROSS-REFERENCE TO RELATED APPLICATION

This application claims the benefit of and priority under 35 U.S.C. §119 to Korean Patent Application No. 10-2013-0085832, filed on Jul. 22, 2013, the disclosure of which is hereby incorporated herein by reference in its entirety.

FIELD

The present disclosure herein relates to temporary bonding adhesive compositions and methods of manufacturing a semiconductor device using the same.

BACKGROUND

In order to manufacture a highly integrated semiconductor package having a high capacity, a plurality of semiconductor chips may be stacked. When a semiconductor package is formed, a backside of a substrate on which no circuits, e.g., conductive bumps are formed, may be grinded, and a plurality of semiconductor chips may be stacked to be connected to each other. However, the substrate may be damaged during the grinding process, and thus a temporary adhesive layer may be formed between the substrate and a support substrate so that the substrate may be fixed. Thereafter, the substrate on which the semiconductor chips are stacked may be separated from the support substrate. However, if the temporary adhesive layer has a low durability with respect to the grinding process, or has low debonding characteristics, the conductive bumps may collapse and generate short-circuits.

SUMMARY

Various embodiments of the present inventive concepts provide a temporary bonding adhesive composition. The temporary bonding adhesive composition may have good adhesion and debonding characteristics.

In some embodiments, a method of manufacturing a semiconductor device is provided. The method may include using a temporary bonding adhesive composition having good adhesion and debonding characteristics.

According to further embodiments, a temporary bonding adhesive composition may include a first compound including a thermosetting polyorganosiloxane and a second compound including a thermoplastic polyorganosiloxane.

In some embodiments, a temporary bonding adhesive composition may comprise a first composition comprising a thermosetting polyorganosiloxane, and a second composition comprising a thermoplastic polyorganosiloxane.

In some embodiments, the thermosetting polyorganosiloxane may be a siloxane polymer having a structure represented by Formula 1:

Formula (1)

In certain embodiments, a segment of the thermosetting polyorganosiloxane may have a structure represented by Formula 1.

In Formula 1, R1 to R4 may each independently represent a monovalent hydrocarbon group having 1 to 8 carbon atoms (i.e., a $C_1$-$C_8$ monovalent hydrocarbon), m is an integer of 1 to 100, and X is a functional group having a structure represented by Formula 2:

Formula (2)

In Formula 2, R5 and R6 may each independently represent an alkyl group having 1 to 4 carbon atoms (i.e., a $C_1$-$C_4$ alkyl) or an alkoxy group having 1 to 4 carbon atoms (i.e., a $C_1$-$C_4$ alkoxy), k is an integer of 0 to 2, n is 0 or 1, and Y is a functional group having a structure represented by one of Formulas 3 to 5:

Formula (3)

Formula (4)

Formula (5)

In some embodiments, the first compound may further include a cross linking agent and/or a curing catalyst.

In some embodiments, the first compound may further include a filler and/or an antioxidant.

In various embodiments, a thermoplastic polyorganosiloxane may include a monofunctional siloxane in a range of about 0.1 to about 4.0 mol %, a bifunctional siloxane in a range of about 88.8 to about 99.8 mol %, and a tetrafunctional siloxane in a range of about 0.1 to about 8.0 mol %.

In some embodiments, a thermoplastic polyorganosiloxane may include one or more siloxane unit(s) selected from a monofunctional siloxane unit, a bifunctional siloxane unit, and a tetrafunctional siloxane unit. A thermoplastic polyorganosiloxane may include one or more siloxane unit(s) having a structure selected from ($R7R8R9SiO_{1/2}$)p,
($R10R11SiO$)q, and
($SiO_2$)r, wherein R7 to R11 are each independently selected from a $C_1$-$C_{20}$ hydrocarbon, optionally substituted with one or more halogen(s), and p, q, and r are each independently integers of 1 to 100.

In certain embodiments, a thermoplastic polyorganosiloxane may have a molecular weight in a range of about 500,000 to about 1,500,000.

According to some embodiments, a method of manufacturing a semiconductor device may be provided. In the method, a first adhesive layer may be formed on a support substrate using a first compound including a thermosetting polyorganosiloxane. A second adhesive layer may be formed on a substrate using a second compound including a thermoplastic polyorganosiloxane. The first adhesive layer and the second adhesive layer may be bonded to each other, thereby binding the support substrate and the substrate together. The substrate may then be processed. The substrate may subsequently be separated from the support substrate.

In various embodiments, the substrate may have a plurality of first semiconductor chips, and the second adhesive layer may be formed to be in contact with the first semiconductor chips.

In certain embodiments, after separating the substrate from the support substrate, the first adhesive layer formed on the substrate may be removed.

In various embodiments, when the first adhesive layer and the second adhesive layer are bonded to each other, thereby binding the support substrate and the substrate together, a thermocompression bonding process may be performed at a temperature in a range of about 100 to about 200° C.

In various embodiments, the first and/or second adhesive layers may be in a solid state at a room temperature. The first and/or second adhesive layers may have an elastic modulus equal to or greater than about 10 Kpa.

In some embodiments, the first adhesive layer may be formed to have a thickness in a range of about 0.1 to about 200 μm, and the second adhesive layer may be formed to have a thickness in a range of about 0.1 to about 20 Kpa.

In some embodiments, the second adhesive layer may be formed to have an adhesion in a range of about 2 about 20 μm.

In some embodiments, when the first adhesive layer is formed on the support substrate, the first compound may be coated on the support substrate. The support substrate on which the first compound is coated may be soft-backed.

In some embodiments, when the substrate is processed, the substrate may be grinded until the first semiconductor chips are exposed. A plurality of second semiconductor chips may be adhered to the substrate. The second semiconductor chips may be electrically connected to the first semiconductor chips.

According to some embodiments, a temporary bonding adhesive composition may include first and second compounds having good adhesion and debonding characteristics, and thus the temporary bonding adhesive composition may have improved adhesion and debonding characteristics. Therefore, a temporary bonding adhesive agent having a high durability with respect to physical processes, e.g., a grinding process, a debonding process, etc., may be formed using the temporary bonding adhesive composition.

Moreover, when a semiconductor package in which a plurality of semiconductor chips are stacked is formed, first and second adhesive layers may be formed between a substrate and a support substrate using a temporary bonding adhesive composition, and thus the substrate may be strongly fixed to the support substrate, while the substrate may be easily separated from the support substrate. As a result, short-circuits may not be generated during the grinding process and/or the debonding process.

BRIEF DESCRIPTION OF THE DRAWINGS

The above and other features and advantages of the disclosure will become more apparent in view of the attached drawings and accompanying detailed description.

DESCRIPTION OF EMBODIMENTS

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

If an embodiment is differently realizable, a specified operation order may be differently performed from a described order. For example, two consecutive operations may be substantially simultaneously performed, or in an order opposite to the described order.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term "about," as used herein when referring to a measurable value, such as an amount or concentration and the like, is meant to refer to variations of up to ±20% of the specified value, such as, but not limited to, ±10%, ±5%, ±1%, ±0.5%, or even ±0.1% of the specified value, as well as the specified value. For example, "about X" where X is the measurable value, includes X as well as a variation of ±20%, ±10%, ±5%, ±1%, ±0.5%, or ±0.1% of X. A range provided herein for a measurable value may include any other range and/or individual value therein.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the present inventive concept and relevant art and should not be interpreted in an idealized or overly formal sense unless expressly so defined herein.

According to some embodiments, a temporary bonding adhesive composition may include a first compound comprising a thermosetting polyorganosiloxane and a second compound comprising a thermoplastic polyorganosiloxane.

The first compound may include a siloxane polymer having a structure represented by following Formula 1 as the thermosetting polyorganosiloxane, a cross linking agent and/or a curing catalyst. In some embodiments, a segment of the first compound and/or thermosetting polyorganosiloxane has a structure represented by Formula 1.

Formula (1)

In Formula 1, R1 to R4 each independently represent a monovalent hydrocarbon having 1 to 8 carbon atoms, m is an integer of 1 to 100, and X represents a functional group having a structure represented by following Formula 2.

Formula (2)

In Formula 2, R5 and R6 each independently represent $C_1$-$C_4$ alkyl or $C_1$-$C_4$ alkoxy, k is an integer of 0 to 2, n is 0 or 1, and Y represents a functional group having a structure represented by one of following Formulas 3 to 5.

Formula (3)

Formula (4)

Formula (5)

The siloxane polymer may have good adhesion and debonding characteristics, and thus when a temporary bonding adhesive agent is formed using the first compound including the siloxane polymer, the temporary bonding adhesive agent may have a high durability with respect to physical processes, e.g., a grinding process, and good debonding characteristics. In some embodiments, the siloxane polymer may have a molecular weight in a range of about 10,000 to about 200,000. In some embodiments, the first compound may be in a solid state at room temperature and/or may have an elastic modulus equal to or greater than about 10 Kpa. The siloxane polymer may be cured at a temperature in a range of about 100 to about 200° C.

The cross linking agent may cross link the siloxane polymer. Exemplary cross linking agents include, but are not limited to, formalin, formalin-alcohol, melamine resin, urea resin, a phenolic compound including at least two methylols or at least two alkoxymethylols, and/or an epoxy compound including at least two epoxy functional groups. In some embodiments, a cross linking agent may be present in an amount in a range of about 5 to about 30 percent by weight, based on a total weight of the first compound. In some embodiments, a cross linking agent may be present in an amount in a range of about 10 to about 25 percent by weight, based on a total weight of the first compound.

The curing catalyst may cause a curing reaction of the siloxane polymer. Exemplary curing catalysts include, but are not limited to, acid anhydrides. In some embodiments, a curing catalyst may be present in an amount in a range of equal to or less than about 5 percent by weight based on the total weight of the first compound.

In some embodiments, the first compound may further include an additive agent, such as, but not limited to, an antioxidant, and/or a filler, such as, but not limited to, silica. The additive agent and/or filler may provide thermal stability with respect to the curing reaction of the siloxane polymer. In some embodiments, an additive agent may be present in an amount in a range of equal to or less than about 50 percent by weight based on the total weight of the first compound.

However, the composition ratio of the cross linking agent, the curing agent, and the additive agent may not be limited thereto. In some embodiments, the composition ratio may be changed in accordance with a curing degree of the first compound.

The second compound may include a monofunctional siloxane represented by formula $(R7R8R9SiO_{1/2})p$ in a range of about 0.1 to about 4.0 mol %, a bifunctional siloxane represented by formula $(R10R11SiO_{1/2})q$ in a range of about 88.8 to about 99.8 mol %, and a tetrafunctional siloxane represented by formula $(SiO_2)r$ in a range of about 0.1 to about 8.0 mol %, wherein R7 to R11 each independently represent a hydrocarbon with hydrogen atoms optionally substituted with halogen atoms, and p, q and r each represent an integer equal to or greater than 1, such as, but not limited to, an interger of 1 to 100. The hydrocarbon may include a monovalent hydrocarbon, such as, but not limited to, methyl, ethyl, n-propyl, isopropyl, n-butyl, t-butyl, n-pentyl, cyclopentyl, n-hexyl, etc., and a cycloalkyl group such as, but not limited to, cyclohexyl, an aryl group such as, but not limited to, phenyl and tolyl, etc., and any combination thereof.

An interfacial adhesion strength of the second compound may be controlled with the composition ratio of the monofunctional siloxane, the bifuntional siloxane and tetrafunctional siloxane, and thus the second compound may have an adhesion in a range of about 2 to about 20 gf. As a result, the second compound may have both of good adhesion and good debonding characteristics.

In some embodiments, the thermoplastic polyorganosiloxane may have a molecular weight in a range of about 500,000 to about 1,500,000. In certain embodiments, the second compound may be in a solid state at a room temperature and/or may have an elastic modulus equal to or greater than about 10 Kpa.

As described above, the first and second compounds may have good adhesion and debonding characteristics, and thus the temporary bonding adhesive composition including the first and second compounds may have improved adhesion and debonding characteristics. In some embodiments, a temporary bonding adhesive composition may increase or improve the integration level of a semiconductor device. In some embodiments, a temporary adhesive agent may be formed using the temporary bonding adhesive composition to have a high durability with respect to physical processes, such as, but not limited to, a grinding process, a debonding process, etc.

FIGS. 1 to 8 are cross-sectional views illustrating various stages of a method of manufacturing a semiconductor device in accordance with exemplary embodiments of the present inventive concept.

Figure 1:
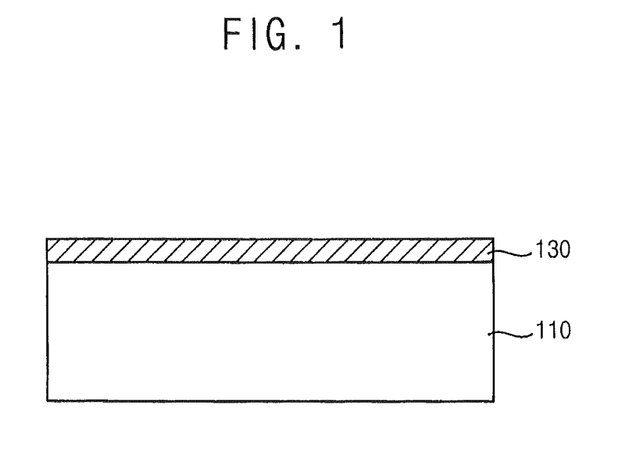
FIG. 1 is a cross-sectional view of a support substrate comprising a first adhesive layer, according to various embodiments of the present inventive concepts.

Referring to FIG. 1, a first adhesive layer 130 may be formed on a support substrate 110 using a first compound including a thermosetting polyorganosiloxane.

In example embodiments, the first adhesive layer 130 may be formed by the following steps. The first compound may be dissolved in a solvent to form a first temporary bonding adhesive composition, the first temporary bonding adhesive composition may then be coated on the support substrate 110 such as, for example, by spin coating, roll coating, die coating, etc. The support substrate 110 on which the first temporary bonding adhesive composition is coated may be soft-baked.

The first compound may include a siloxane polymer represented by Formula 1 as the thermosetting polyorganosiloxane, a cross linking agent, and a curing catalyst. In some embodiments, the first compound may further include an additive agent, such as, for example, an antioxidant, or a filler, such as, for example, a silica, for the thermal stability thereof with respect to the curing reaction of the siloxane polymer. Due to good adhesion and debonding characteristics of the siloxane polymer, when the first adhesive layer 130 is formed using the first compound including the siloxane polymer, the first adhesive layer 130 may have a high durability with respect to physical processes, e.g., a grinding process, a debonding process, etc. In addition, the first compound may be in a solid state and/or may have an elastic modulus equal to or greater than about 10 Kpa, and thus, in some embodiments, the first adhesive layer 130 may be formed to have a reduced total thickness variation (TTV).

In some embodiments, a cross linking agent may be present in an amount in a range of about 5 to about 30 percent by weight, based on a total weight of the first compound. In certain embodiments, a cross linking agent may be present in an amount in a range of about 10 to about 25 percent by weight, based on a total weight of the first compound. A curing catalyst may be present in an amount in a range of equal to or less than about 5 percent by weight based on the total weight of the first compound. An additive agent may be present in an amount in a range of equal to or less than about 50 percent by weight based on the total weight of the first compound. However, the composition ratio of the cross linking agent, the curing agent and the additive agent may not be limited thereto, but may be changed in accordance with a curing degree of the first compound.

Exemplary solvents for the first compound include, but are not limited to, ketone containing compounds such as cyclohexanone, cyclopentanone or methyl-2-n-amylketone; alcohol containing compounds such as 3-methyl butanol or 1-methoxy-2-propanol; ether containing compounds such as propylene glycol mononethyl ether or propylene glycol dimethyl ether, ester containing compounds such as propylene glycol monomethyl ether acetate (PGMEA) or ethyl lactate, and any combination thereof.

Alternatively, in some embodiments, a film-type first temporary bonding adhesive agent may be formed using the first compound. The film-type first temporary bonding adhesive agent may be adhered onto the support substrate 110 to form the first adhesive layer 130.

If the first adhesive layer 130 is formed to have a thickness less than about 10 µm, the first adhesive layer 130 may have a very low adhesion, and thus a substrate 210 (refer to FIG. 3) bonded to the support substrate 110 may be damaged due to a mechanical stress generated during a grinding process. If the first adhesive layer 130 is formed to have a thickness greater than about 200 µm, the first adhesive layer 130 may have a very high adhesion, and thus the substrate 210 may not be separated from the support substrate 110 during a debonding process. In some embodiments, the first adhesive layer 130 may be formed to have a thickness in a range of about 10 µm to about 200 µm. In certain embodiments, the first adhesive layer 130 may be formed to have a thickness in a range of about 20 µm to about 120 µm. In some embodiments, the first adhesive layer 130 may have a uniformity for a bonding process, and a grinding process and a debonding process may be performed easily. In certain embodiments, a first adhesive layer 130 having a thickness in a range of about 10 µm to about 200 µm may provide a uniformity for a bonding process, and be suitable for a grinding process and a debonding process.

Figure 2:
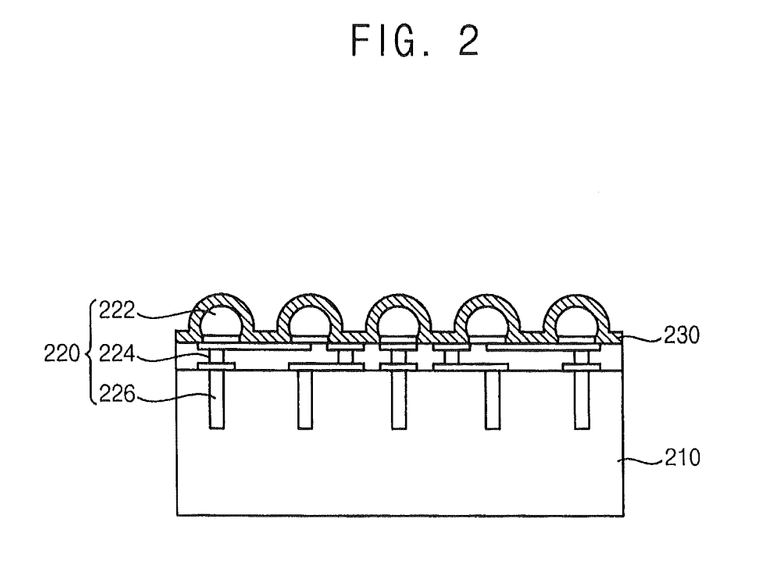
FIG. 2 is a cross-sectional view of a substrate comprising a second adhesive layer, according to various embodiments of the present inventive concepts.

Referring to FIG. 2, a second adhesive layer 230 may be formed on a substrate 210 having a plurality of first semiconductor chips 220 thereon using a second compound including a thermoplastic polyorganosiloxane. The second adhesive layer 230 may contact the plurality of first semiconductor chips 220.

In some embodiments, the second adhesive layer 230 may be formed by the following steps. A second compound may be dissolved in a solvent to form a second temporary bonding adhesive composition, the second temporary bonding adhesive composition may be coated on the substrate 210 by, for example, spin coating, roll coating, die coating, etc. The substrate 210 on which the second temporary bonding adhesive composition is coated may be soft-baked.

The second compound may include a monofunctional siloxane in a range of about 0.1 to about 4.0 mol %, a bifunctional siloxane in a range of about 88.8 to about 99.8 mol %, and a tetrafunctional siloxane in a range of about 0.1 to about 8.0 mol %, as the thermoplastic polyorganosiloxane. An interfacial adhesion strength of the second compound may be controlled with a composition ratio of the monofunctional siloxane, the bifuntional siloxane and tetrafunctional siloxane. In some embodiments, the second compound may have an adhesion in a range of about 2 to about 20 gf. If the second adhesive layer 230 has an adhesion less than about 2 gf, then the substrate 210 may be separated from the support substrate 110 easily and damaged during a grinding process. If the second adhesive layer 230 has an adhesion greater than about 20 gf, then the substrate 210 may not be separated from the support substrate 110 during a debonding process. In certain embodiments, the second adhesive layer 230 may have good adhesion and debonding characteristics due to the above-mentioned composition ratio. A second compound may be in a solid state at a room temperature and/or may have an elastic modulus equal to or greater than about 10 Kpa, and thus the second adhesive layer 230 may be formed to have a reduced total thickness variation (TTV).

Exemplary solvents for the second compound include, but are not limited to, pentane, hexane, cyclohexane, isononane, p-methane, ethylcyclohexane, iso-dodecane, limonene, etc., and any combination thereof.

Alternatively, in some embodiments, a film type second temporary bonding adhesive agent may be formed using a second compound. The second temporary bonding adhesive agent may be adhered onto the substrate 210 to form the second adhesive layer 230.

If the second adhesive layer 230 is formed to have a thickness less than about 0.1 µm, the second adhesive layer 230 may have a very low adhesion, and thus the substrate 210 may be separated from the support substrate 110 easily and damaged during a grinding process. If the second adhesive layer 230 is formed to have a thickness greater than about 20 µm, the second adhesive layer 230 may have a very high adhesion, and thus the substrate 210 may not be separated from the support substrate 110 during a debonding process. In some embodiments, the second adhesive layer 230 may be formed to have a thickness in a range of about 0.1 to about 20 µm. In some embodiments, a second adhesive layer 230 may have a uniformity for a bonding process, and a grinding process and a debonding process may be performed easily. In certain embodiments, a second adhesive layer 230 having a thickness in a range of about 0.1 to about 20 µm may provide a uniformity for a bonding process, and be suitable for a grinding process and a debonding process.

In some embodiments, the first semiconductor chip 220 may include a first conductive bump 222, a first connector 224, and a plug 226 subsequently stacked. The first conductive bump 222 may be electrically connected to a bonding pad (not shown) via the first connector 224. The plug 226 may be buried in the substrate 210, and thus a bottom surface of the plug 226 may not be exposed, and may be electrically connected to the first conductive bump 222 via the first connector 224. Accordingly, a second adhesive layer 230 may be formed on a surface, such as a top surface, of the first conductive bump 222 and the first connector 224. In some embodiments, a plurality of first semiconductor chips 220 may be formed, and thus a plurality of conductive bumps 222, a plurality of first connectors 224 and a plurality of plugs 226 may be formed.

Figure 3:
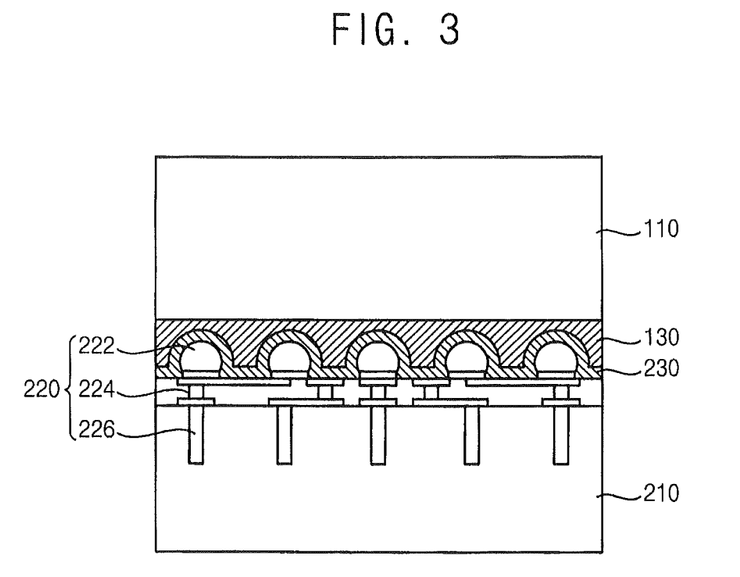
FIG. 3 is a cross-sectional view of a support substrate bonded to a substrate, according to various embodiments of the present inventive concepts.

Referring to FIG. 3, the first adhesive layer 130 and the second adhesive layer 230 may be contacted to each other, thereby forming an interface between the first adhesive layer 130 and the second adhesive layer 230. In some embodiments, the first adhesive layer 130 and the second adhesive layer 230 may be bonded to each other so that the support substrate 110 and substrate 210 may be bonded to each other.

In some embodiments, the support substrate 110 and the substrate 210 may be bonded by applying a pressure equal to or greater than about 10 kN on an interface therebetween. A total thickness of the first and second adhesive layers 130 and 230 may be greater than a thickness of the first conductive bump 222, and thus the first and second adhesive layers 130 and 230 may cover the first conductive bumps 222 and sufficiently fill spaces between the first conductive bumps 222. Accordingly, the first semiconductor chips 220 may be supported by the first and second adhesive layers 130 and 230, and short-circuits due to the collapse of the first conductive bumps 222 may not be generated.

Figure 4:
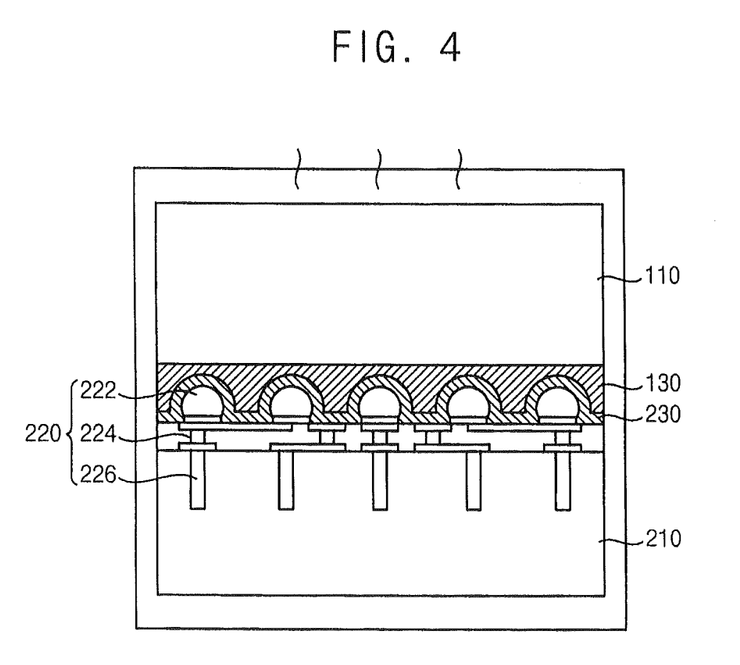
FIG. 4 is a cross-sectional view of a support substrate bonded to a substrate during heating, according to various embodiments of the present inventive concepts.

Referring to FIG. 4, the bonded substrate 210 and the support substrate 110 may be heated. Accordingly, the first and second adhesive layers 130 and 230 may be cured, and thus the substrate 210 and the support substrate 110 may be bonded with each other more strongly.

In some embodiments, the first and second adhesive layers 130 and 230 may be cured at a temperature equal to or greater than about 100° C. In certain embodiments, the first and second adhesive layers 130 and 230 may be cured at a temperature in a range of about 100 to about 200° C. The siloxane polymer of the first adhesive layer 130 may have a curing temperature of about 100 to about 200° C., and thus, if the first and second adhesive layers 130 and 230 are cured at a temperature lower than about 100° C., a void may be generated in the first adhesive layer 130, and a total thickness variation (TTV) of the first and second adhesive layers 130 and 230 may be increased. Accordingly, the bonded substrate 210 and the support substrate 210 may be heated at a temperature equal to or greater than about 100° C., such as, but not limited to, a temperature in a range of about 100 to about 200° C.

Figure 5:
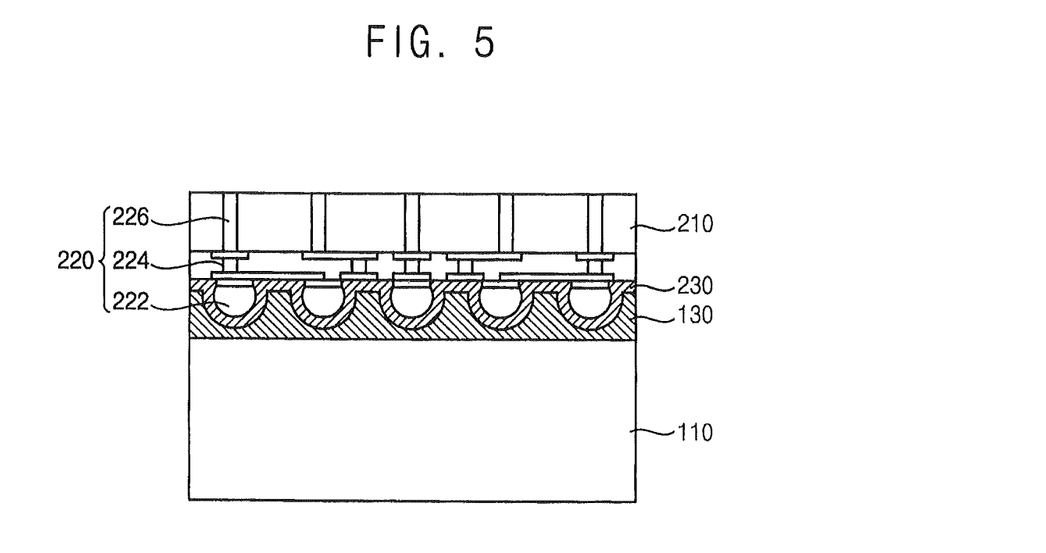
FIG. 5 is a cross-sectional view of a support substrate bonded to a substrate after a grinding process, according to various embodiments of the present inventive concepts.

Referring to FIG. 5, a portion of the substrate 210 in which no first conductive bumps 222 are formed may be grinded by, for example, a chemical mechanical polishing (CMP) process until the first semiconductor chips 220 may be exposed. Accordingly, in some embodiments, the bottom surfaces of the plugs 226 may be exposed after the grinding process. Due to the strong adhesion between the substrate 210 and the support substrate 110 via the first and second adhesive layers 130 and 230, the substrate 210 may not be separated from the support substrate 110 despite of a strong mechanical stress generated during the grinding process. Thus, the first semiconductor chips 220 formed in the substrate 210 may not collapse. Therefore, short-circuits caused by damage in the substrate 210 may not be generated.

Figure 6:
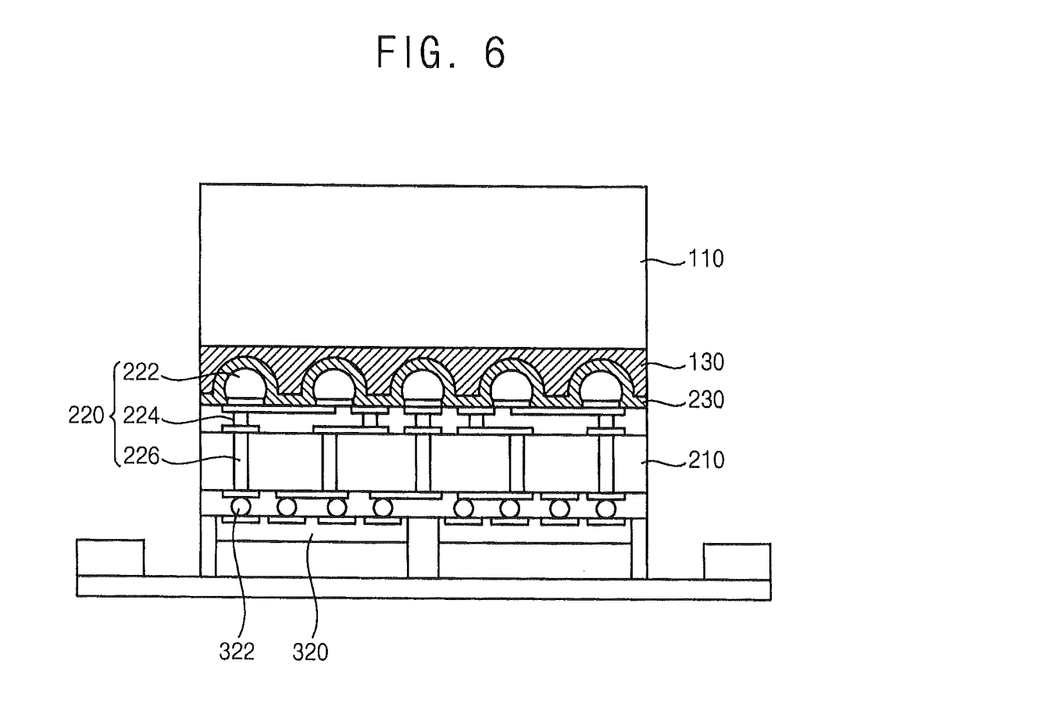
FIG. 6 is a cross-sectional view of a substrate adhered to a plurality of second semiconductor chips, according to various embodiments of the present inventive concepts.

Referring to FIG. 6, a plurality of second semiconductor chips 320 may be adhered to the grinded surface of the substrate 210 by, for example, a thermocompression bonding process, and electrically connected to the first semiconductor chips 220 to form a semiconductor package.

A second conductive bump 322 may be formed on a top surface of each second semiconductor chip 320 and electrically connected to a bonding pad (not shown) thereof via a second connector (not shown). The second conductive bumps 322 may be electrically connected to the plugs 226, and thus the first and second semiconductor chips 220 and 320 may be electrically connected to each other.

Figure 7:
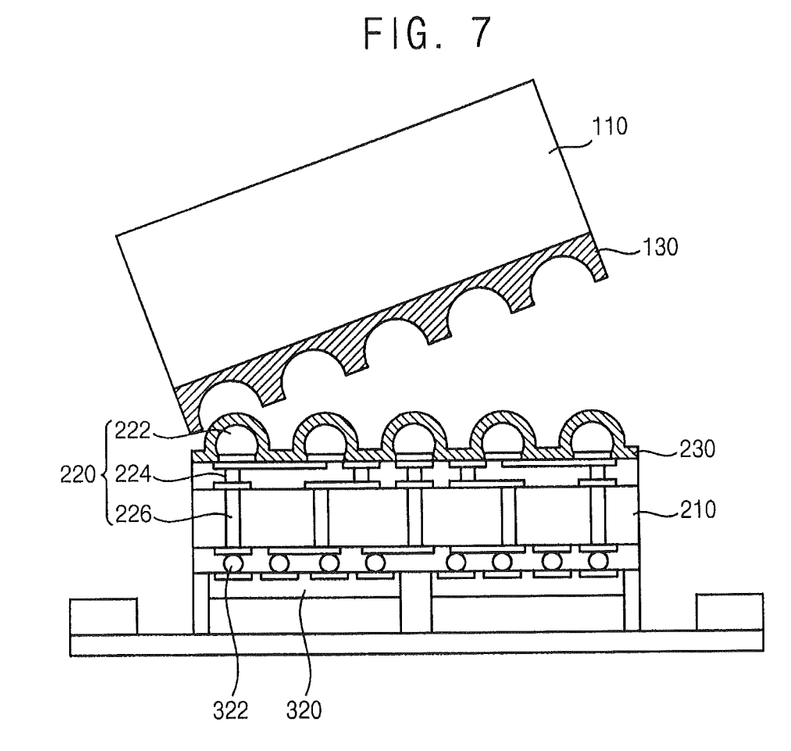
FIG. 7 is a cross-sectional view of a support substrate being separated from a substrate, according to various embodiments of the present inventive concepts.

Referring to FIG. 7, the first and second adhesive layers 130 and 230 may be separated from each other so that the substrate 210 may be separated from the support substrate 110.

To separate the first and second adhesive layers 130 and 230 from each other, a physical external force may be applied to the interface between the first and second adhesive layers 130 and 230 in a direction substantially perpendicular to the interface. Due to the total thickness and the elastic modulus of the first and second adhesive layers 130 and 230, the first and second adhesive layers 130 and 230 may be easily separated. Even though a mechanical stress may be increased in the substrate 210 during the debonding process, cracks may not be generated in the interface, and the first conductive bumps 222 may not be damaged.

Alternatively, in some embodiments, the substrate 210 may be separated from the support substrate 110 using, e.g., a tape.

Figure 8:
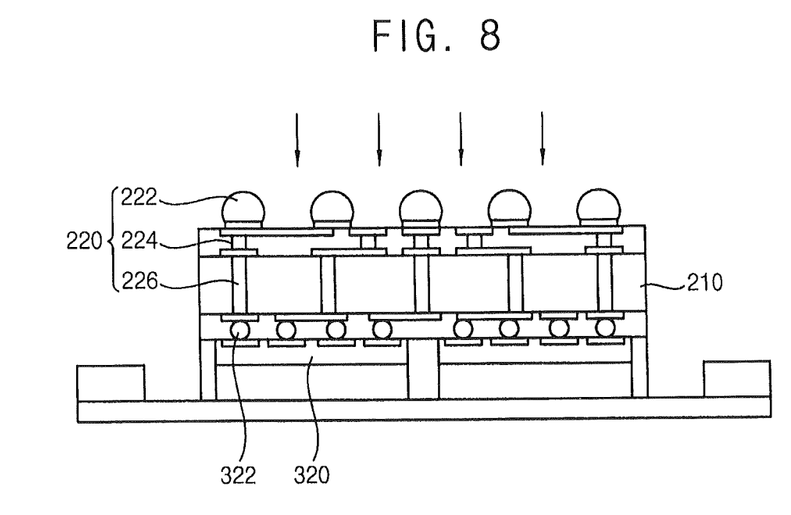
FIG. 8 is a cross-sectional view of a substrate having a second adhesive layer removed, according to various embodiments of the present inventive concepts.

Referring to FIG. 8, the second adhesive layer 230 formed on the substrate 210 may be removed using an organic solvent.

In some embodiments, the substrate 210 including the second adhesive layer 230 may be contacted with an organic solvent to remove the second adhesive layer 230. In certain embodiments, the substrate 210 including the second adhesive layer 230 may be dipped into the organic solvent and/or the organic solvent may be sprayed onto a top surface of the second adhesive layer 230 so that the second adhesive layer 230 may be removed.

Exemplary organic solvents include, but are not limited to, iso-dodecane, p-methane, nonane, hexane, etc., and any combination thereof.

As described above, when the semiconductor package including the plurality of semiconductor chips 220 and 320 is formed, the first and second adhesive layers 130 and 230 may be formed between the substrate 210 and the support substrate 110 using the first and second compounds having good adhesion and debonding characteristics, and thus the substrate 210 and support substrate 110 may be separated easily. Furthermore, the first and second adhesive layers 130 and 230 may be formed to have a sufficient thickness and a sufficient elastic modulus, and thus the first and second adhesive layers 130 and 230 may have a reduced total thickness variation (TTV). As a result, the damage of substrate 210 may be reduced and short-circuits therein may not be generated during a grinding process and/or debonding process.

According to some embodiments, a method of forming a temporary bonding adhesive composition may be provided. The method may include forming the first adhesive layer 130 on at least one surface of the support substrate 110 and forming the second adhesive layer 230 on at least one surface the substrate 210. In some embodiments, the first and second adhesive layers 130 and 230 are each separately formed on at least one upper surface of the support substrate 110 and substrate 210, respectively.

The first adhesive layer 130 may include a thermosetting polyorganosiloxane and the second adhesive layer 230 may include a thermoplastic polyorganosiloxane. In some embodiments, the forming step may include contacting (e.g., spraying, placing, rolling, and the like) a first temporary bonding adhesive composition to the support substrate 110 and/or contacting (e.g., spraying, placing, rolling, and the like) a second temporary bonding adhesive composition to the substrate 210. In some embodiments, the forming step may include spin coating, roll coating, die coating and/or the like a first and/or second temporary bonding adhesive composition. Optionally, the support substrate 110 including the first temporary bonding adhesive composition and/or the substrate 210 including the second temporary bonding adhesive composition may be soft-baked. In some embodiments, the forming step may include contacting a film-type first temporary bonding adhesive agent to a support substrate 110 and/or contacting a film-type second temporary bonding adhesive composition to a substrate 210.

After the forming steps, the first adhesive layer 130 and the second adhesive layer 230 may be contacted to create an interface between the support substrate 110 and substrate 210. In some embodiments, the first adhesive layer 130 and second adhesive layer 230 are contacted so as to bind or adhere the first and second layers 130 and 230 together. The first adhesive layer 130 and second adhesive layer 230 may be bonded or adhered together such that a physical external force is needed to separate the two layers. In some embodiments, at least one component in the first composition is bonded to at least one component in the second composition. In some embodiments, bonding may include chemical bonding such as, for example, covalent and/or noncovalent interactions. After the contacting step, the substrate 210 may be processed and, subsequently, the substrate 210 and support substrate 110 may be separated.

In some embodiments, a method described herein may increase or improve the integration level of a semiconductor device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An article of manufacture comprising:
    a first composition including a thermosetting polyorganosiloxane; and
    a second composition including a thermoplastic polyorganosiloxane,
    wherein the thermosetting polyorganosiloxane is a siloxane polymer represented by following Formula 1:

Formula (1)

wherein, R1 to R4 each independently represent a monovalent hydrocarbon having 1 to 8 carbon atoms, m is an integer of 1 to 100, and X indicates a functional group represented by following Formula 2:

Formula (2)

wherein R5 and R6 each independently represent alkyl or alkoxy having 1 to 4 carbon atoms, k is an integer of 0 to 2, n is 0 or 1, and Y indicates a functional group represented by one of following Formulas 3 to 5:

Formula (3)

Formula (4)

Formula (5)

and
wherein the thermoplastic polyorganosiloxane includes:
    about 0.1 to about 4.0 mol % of a monofuntional siloxane unit(s);
    about 88.8 to about 99.8 mol % of a bifunctional siloxane unit(s); and
    about 0.1 to about 8.0 mol % of a tetrafunctional siloxane unit(s).

2. The article of manufacture of claim 1, wherein the first composition further includes a cross linking agent and a curing catalyst.

3. The article of manufacture of claim 1, wherein the first composition further includes a filler or an antioxidant.

4. The article of manufacture of claim 1, wherein the thermoplastic polyorganosiloxane has a molecular weight of in a range of about 500,000 to about 1,500,000.

5. A method of manufacturing a semiconductor device, the method comprising:
    forming a first adhesive layer on a support substrate using a first composition including a thermosetting polyorganosiloxane;
    forming a second adhesive layer on a substrate using a second composition including a thermoplastic polyorganosiloxane;
    binding the first adhesive layer and the second adhesive layer to bind the support substrate and the substrate;
    processing the substrate; and
    separating the substrate from the support substrate,
    wherein the thermosetting polyorganosiloxane is a siloxane polymer represented by following Formula 1:

Formula (1)

wherein, R1 to R4 each independently represent a monovalent hydrocarbon having 1 to 8 carbon atoms, m is an integer of 1 to 100, and X indicates a functional group represented by following Formula 2:

wherein R5 and R6 each independently represent alkyl or alkoxy having 1 to 4 carbon atoms, k is an integer of 0 to 2, n is 0 or 1, and Y indicates a functional group represented by one of following Formulas 3 to 5:

and
wherein the thermoplastic polyorganosiloxane includes:
about 0.1 to about 4.0 mol % of a monofuntional siloxane units;
about 88.8 to about 99.8 mol % of a bifunctional siloxane units; and
about 0.1 to about 8.0 mol % of a tetrafunctional siloxane units.

6. The method of claim 5, wherein the substrate has a plurality of first semiconductor chips, and the second adhesive layer is formed to contact the first semiconductor chips.

7. The method of claim 5, after separating the substrate from the support substrate, further comprising removing the first adhesive layer formed on the substrate.

8. The method of claim 5, wherein binding the first adhesive layer and the second adhesive layer to bind the support substrate and the substrate further includes performing a thermocompression bonding process at a temperature in a range of about 100 to about 200° C.

9. The method of claim 5, wherein the first and second adhesive layers are in a solid state at a room temperature and have an elastic modulus equal to or greater than about 10 Kpa.

10. The method of claim 5, wherein the first adhesive layer is formed to have a thickness in a range of about 0.1 to about 200 µm, and the second adhesive layer is formed to have a thickness in a range of about 0.1 to about 20 µm.

11. The method of claim 5, wherein the second adhesive layer is formed to have an adhesion of about 2 about 20 gf.

12. The method of claim 5, wherein forming the first adhesive layer on the support substrate includes:
coating the first composition on the support substrate; and
soft-baking the support substrate on which the first composition is coated.

13. The method of claim 5, wherein processing the substrate includes:
grinding the substrate until the first semiconductor chips are exposed; and
adhering a plurality of second semiconductor chips to the substrate,
wherein the second semiconductor chips are electrically connected to the first semiconductor chips.

14. An article of manufacture comprising:
a first composition comprising a thermosetting polyorganosiloxane, and
a second composition comprising a thermoplastic polyorganosiloxane,
wherein the thermoplastic polyorganosiloxane comprises:
one or more monofuntional siloxane unit(s) in a range of about 0.1 to about 4.0 mol %;
one or more bifunctional siloxane unit(s) in a range of about 88.8 to about 99.8 mol %; and
one or more tetrafunctional siloxane unit(s) in a range of about 0.1 to about 8.0 mol %.

15. The article of manufacture of claim 14, wherein the thermosetting polyorganosiloxane comprises a segment having the structure represented by:

wherein R1 to R4 each independently represent a $C_1$-$C_8$ hydrocarbon,
m is an integer of 1 to 100, and
X has a structure represented by:

wherein R5 and R6 each independently represent a $C_1$-$C_4$ alkyl or $C_1$-$C_4$ alkoxy,
k is an integer of 0 to 2,
n is 0 or 1, and
Y has a structure represented by:

Formula (5)

16. The article of manufacture of claim 14, wherein the first composition and the second composition are in contact with each other to form an interface therebetween and the first composition and second composition are adhered to each other.

17. The article of manufacture of claim 14, wherein the first composition further includes a cross linking agent and a curing catalyst.

18. The article of manufacture of claim 14, wherein the thermoplastic polyorganosiloxane has a molecular weight of in a range of about 500,000 to about 1,500,000.

* * * * *